United States Patent
Majeed et al.

(10) Patent No.: US 11,448,716 B1
(45) Date of Patent: Sep. 20, 2022

(54) OPTIMIZATION OF MR IMAGING SEQUENCE

(71) Applicant: Siemens Healthcare GmbH, Erlangen (DE)

(72) Inventors: Waqas Majeed, Ellicott City, MD (US); David Grodzki, Erlangen (DE); Florian Maier, Buckenhof (DE); Himanshu Bhat, Newton, MA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/236,226

(22) Filed: Apr. 21, 2021

(51) Int. Cl.
   *G01R 33/54* (2006.01)
   *G01R 33/38* (2006.01)

(52) U.S. Cl.
   CPC ........... *G01R 33/543* (2013.01); *G01R 33/38* (2013.01)

(58) Field of Classification Search
   CPC .............................. G01R 33/543; G01R 33/38
   See application file for complete search history.

(56) References Cited

U.S. PATENT DOCUMENTS

2020/0064426 A1* 2/2020 Ersoz ................. G01R 33/3852

* cited by examiner

*Primary Examiner* — G. M. A Hyder

(57) ABSTRACT

The invention relates to a method for optimizing an MR imaging sequence with a plurality of sequence blocks where gradient requirements of logical gradients switched along axes including a read, slice, and phase axis are determined. Based on the requirements, a reference gradient is determined among the logical gradients having a longest minimum duration relative to remaining logical gradients within the sequence block during which the reference gradient is switched on. A scaling factor is determined for each of the logical gradients. The scaling factors for the logical gradient factors are updated taking into account the determined stretch ratios, and optimized amplitudes are determined for the logical gradients based on the updated scaling factors.

23 Claims, 5 Drawing Sheets

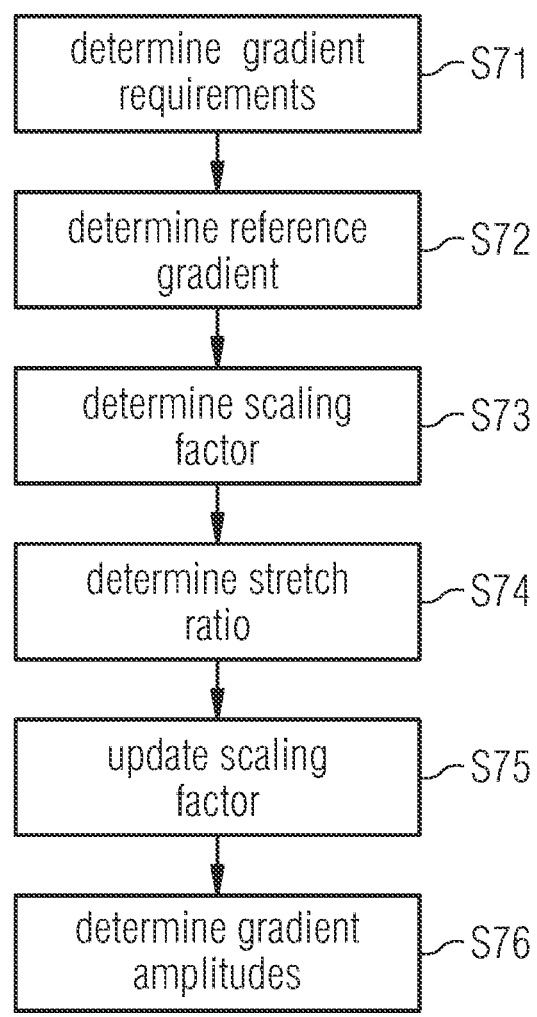

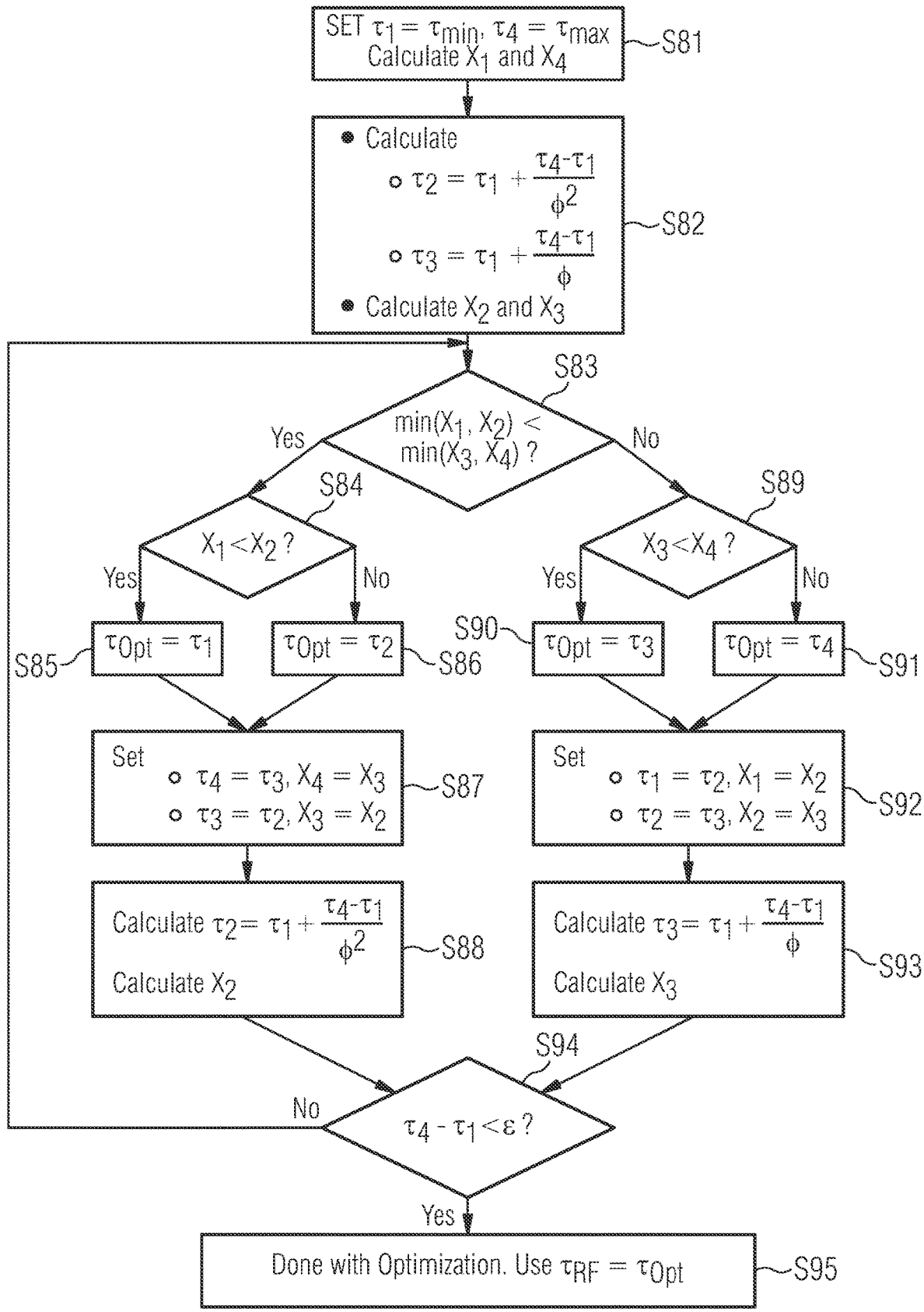

OPTIMIZATION OF MR IMAGING SEQUENCE

TECHNICAL FIELD

The present application relates to a method for optimizing an MR imaging sequence, to a system configured to optimize the MR imaging sequence and to a computer readable storage medium.

BACKGROUND

It is often desired to minimize the duration of MRI sequence building blocks. For instance, shorter echo times (TE) lead to a reduction in off-resonance related artifacts and signal decay. A reduction in repetition time (TR) results in reduced image acquisition times and can be especially helpful in achieving improved temporal resolution in interactive real-time imaging applications. Timing of an MRI pulses sequence is determined by the time required to play radiofrequency (RF) pulses and magnetic field gradients, as well additional delays to achieve the desired contrast. Accordingly a need exists to further optimize the timing of an MR imaging sequence.

SUMMARY

This need is met by the features of the independent claims. Further aspects are described in the dependent claims.

A method is provided for optimizing an MR imaging sequence which comprises a plurality of sequence blocks. For at least one of the sequence blocks the gradient requirements are determined for the logical gradients switched along the logical gradient axis including a read axis, a slice axis and a phase encoding axis in the MR imaging sequence. Based on the determined gradient requirements a reference gradient is determined among the logical gradient having a longest minimum duration relative to remaining logical gradients within the sequence block during which the reference gradient is switched on. Furthermore, a scaling factor for each of the logical gradients is determined wherein each scaling factor indicates a relationship between the maximum gradient amplitude along the logical gradient axis and a maximum physical gradient limit along a physical axis. A stretch ratio is determined for each of the remaining logical gradients indicating how a gradient switching period of the remaining logical gradients can be increased within a limit of the longest minimum duration while a corresponding amplitude of the remaining logical gradients is reduced. The scaling factor is then updated for the logical gradient factors taking into account the determined stretch ratios. Optimized amplitudes are determined for the logical gradients based on the updated scaling factors.

Furthermore the corresponding system is provided comprising a processor and a memory and configured to operate as discussed above or as discussed in further detail below. In addition a computer program comprising program code is provided and a carrier comprising the computer program.

Other device systems, methods, features and advantages will be or will become apparent to one with skill in the art upon examination of the following detailed description and figures. It is intended that all such additional systems, methods, features and advantages be included within this description, be within the scope of the invention and be protected by the following claims.

BRIEF DESCRIPTION OF THE DRAWINGS

FIG. 5 shows a further flowchart of a method carried out by the MR system to optimize the imaging sequence.

FIG. 6 shows an example flowchart of an RF pulse optimization.

DETAILED DESCRIPTION

Figure 1:
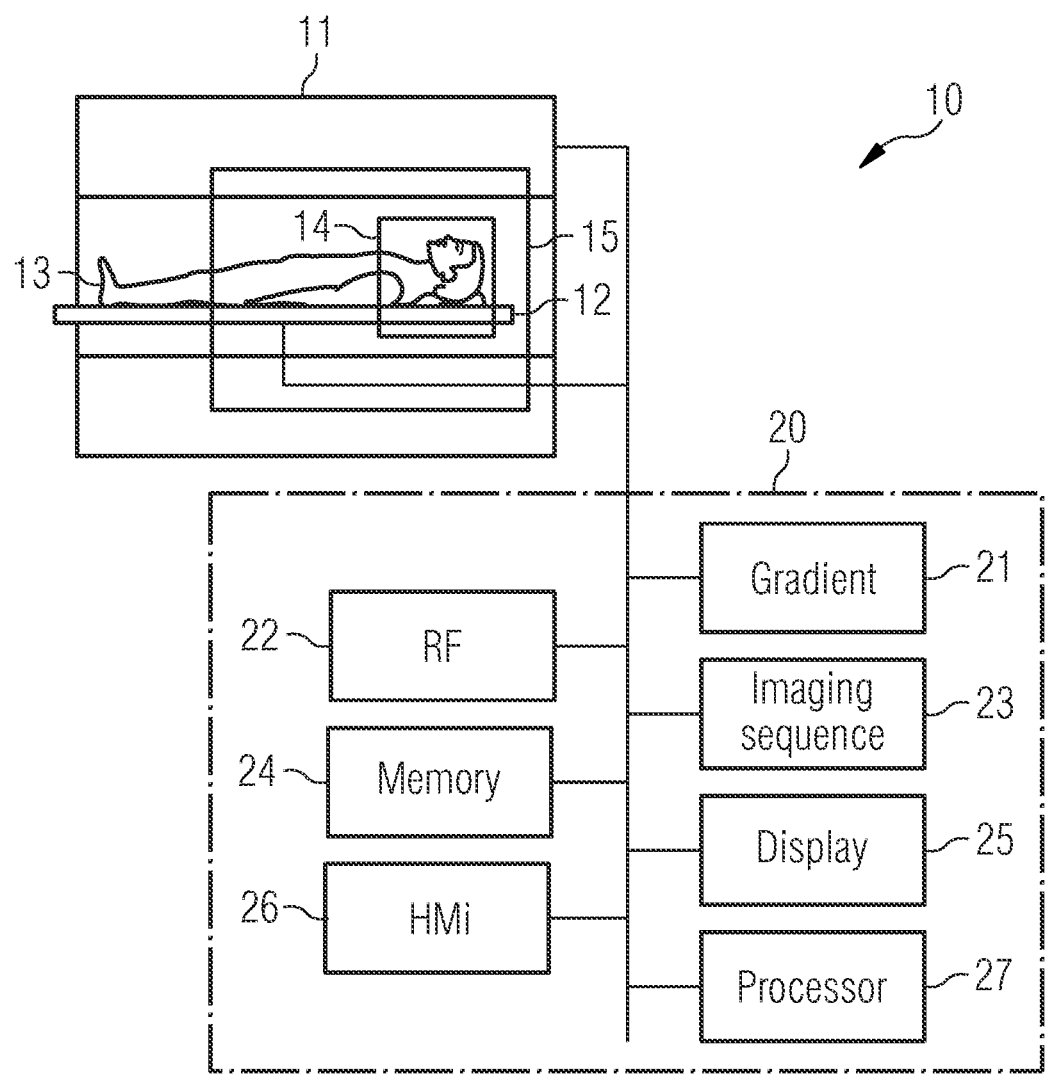
FIG. 1 shows a schematic view of an MR system configured to optimize the MR imaging sequence.

In the following, embodiments of the application will be described in detail with reference to the accompanying drawings. It is to be understood that the following description of embodiments is not to be taken in a limiting sense. The scope is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and the general purpose becomes apparent to a person with skill in the art. Any connection or coupling between functional blocks, devices, components of physical or functional units shown in the drawings and described hereinafter may also be implemented by an indirect connection or coupling. A coupling between components may be established over a wired or wireless connection. Functional blocks may be implemented in hardware, software, firmware, or a combination thereof.

FIG. 1 shows a schematic view of an MR system 10 which comprises a magnet 11 generating a polarizing field BO. An object under examination such as a patient 13 is lying on a table 12 and can be moved into the center of the MR system 10 where MR signals of the patient can be detected after RF excitation by receiving coils 14 which can comprise different coil sections wherein each coil section may be associated with a corresponding detection channel. By applying RF pulses and magnetic field gradients, the nuclear spins of the patient 13, especially the part located in the receiving coil 14 are excited and location coded and the currents induced by relaxation can be detected. A gradient system 15 is schematically shown to generate the magnetic field gradients in order to location code the signal. The way how MR images are generated and how the MR signals are detected using a sequence of RF pulses and the sequence of magnetic field gradients are known in the art, so that a detailed explanation thereof is omitted.

The MR imaging system 10 comprises a control module 20 which is used for controlling the MR imaging system. The control module comprises a gradient control unit 21 for controlling and switching the magnetic field gradients, an RF control unit 22 for controlling and generating the RF pulses for the imaging sequence. An image sequence control unit 23 is provided and configured to control the sequence of the applied RF pulses and magnetic field gradients and thus controls the gradient control unit 21 and the RF control unit 22. In a memory 24, computer programs needed for operating the MR imaging system and the imaging sequences necessary for generating the MR images can be stored together with the generated MR images. The generated MR images can be displayed on a display 25 wherein a human machine interface 26 is provided to be used by an operator of the MR imaging sequence to control the functioning of the MR imaging system 10. A processing unit 27 can coordinate the cooperation of the different functional units shown in FIG. 1 and can comprise one or more processors which can carry out instructions stored on the memory 24. The memory can include the program code to be executed by the processing unit 27. The processing unit can, based on the detected MR signals reconstruct an MR image and can be configured to optimize the imaging sequence as will be discussed in further detail below.

Gradient Usage Optimization:

Gradient control unit 15 of an MR system 10 can generate magnetic field gradients simultaneously in three fixed orthogonal directions X, Y and Z. The coordinate system consisting of X, Y and Z directions is referred to as "Physical Coordinate System", or XYZ coordinate system. Gradient amplitude and slew rate along each direction are limited by maximum values $G_{max}$ and $SR_{max}$.

Definitions

P, R, S: Phase, read and slice axes (or logical axes)
x, y, z: Physical gradient axes
$G_{AbsMax}$ and $SR_{AbsMax}$: Absolute limits on physical gradients
$G_{max}$ and $SR_{max}$: Limits on logical gradients
R: PRS→XYZ rotation matrix
Equations/conclusions presented later remain valid when G is replaced with SR (slew rate)

Magnetic field gradients required for image acquisition are first computed in the logical coordinate system (also known as Phase Read Slice or PRS coordinate system), comprising the read, phase and slice directions for a given slice/slab orientation. The computed PRS gradients are then converted to the XYZ coordinate system using rotation matrix R to determine the physical gradients that need to be played to achieve the desired logical gradients:

$$G_{XYZ} = R \cdot G_{PRS} \quad (1)$$

$$\begin{bmatrix} G_x \\ G_y \\ G_z \end{bmatrix} = \begin{bmatrix} R_{11} & R_{12} & R_{13} \\ R_{21} & R_{22} & R_{23} \\ R_{31} & R_{32} & R_{33} \end{bmatrix} \begin{bmatrix} G_P \\ G_R \\ G_S \end{bmatrix} = \begin{bmatrix} R_{11}G_P + R_{12}G_R + R_{13}G_S \\ \text{etc} \end{bmatrix} \quad (2)$$

Logical gradients can overlap along physical axes for angulated slices. Therefore, physical gradient limits can be exceeded even when PRS gradients individually obey Gmax and SRmax limits. To avoid this situation, most MRI pulse sequences limit maximum logical amplitude and slew rate to Gmax/√3 and SRmax/√3. This ensures that physical gradient limits are not exceeded in the worst-case scenario in which a physical axis is oriented along a logical spatial diagonal AND all logical gradients are played simultaneously with equal amplitudes and slew rates. However, derating by √3 is unnecessary in most situations, especially when slices are only slightly angulated and/or there is a disparity between gradient requirements along logical axes. This results unnecessarily long TR, TE and echo spacing.

Some previously proposed approaches attempt to optimize gradient usage. For instance, adjustment of logical gradient amplitudes and slew rates based on respective gradient area requirements may be used. However, this approach has the following limitations:

Optimization based on gradient area requirements is unsuitable in situations where polarities of logical gradients do not remain fixed during the sequence block of interest, as total gradient area is not a suitable indicator of the gradient load in such cases.

Optimized gradient waveforms are computed for a fixed slice orientation. Therefore, this approach is unsuitable for interactive real-time sequences, where slice orientation is continuously manipulated.

In the following a framework for computing logical gradients is proposed to optimize physical gradient usage and thus minimize the duration required to play a sequence building block. The framework utilizes the time requirement along logical axes (as opposed to area requirement) as an indicator of the gradient load, and therefore can be used regardless of whether the sequence block to be optimized involves logical gradients with switching polarities. This framework can be used even when slice orientation is not known a priori.

RF Duration Optimization:

Every MRI acquisition involves excitation of nuclear spins by a radiofrequency (RF) pulse. The RF pulses can be used to invert nuclear spins or manipulate image contrast. Spatially selective pulses is limited with a magnetic field gradient to restrict their effect to a slice or slab. Further discussion in this section to excitation RF pulses, with a goal to minimize TE. However, it can be expanded to spatially selective RF pulses needed for other purposes.

Thickness TH of the excited slice is related to the slice-select gradient ($G_{SS}$), RF duration ($\tau_{RF}$) and RF bandwidth-time product (BWT) by the following expression:

$$TH = \frac{BWT}{\gamma G_{ss} \tau_{RF}} \quad (3)$$

where γ is the gyromagnetic ratio.

$\tau_{RF}$ as well as ramp time of the slice-select gradient ($\tau_{GssRamp}$) contribute to TR and TE. For fixed TH and BWT:

$$\tau_{RF} \propto 1/G_{ss} \quad (4)$$

Also, for a fixed gradient slew rate:

$$\tau_{GssRamp} \propto G_{ss} \quad (5)$$

Hence $$\tau_{GssRamp} \propto 1/\tau_{RF} \quad (6)$$

Thus, slice-select gradient ramp duration and RF duration are inversely related. To further complicate the issue, a longer $\tau_{GssRamp}$ will result in greater area requirement for slice-select rephase lobe. On the other hand, $\tau_{GssRamp}$ and slice-select rephase lobe duration will only limit the minimal TE if read-rewind and phase encode gradients have a shorter duration in comparison. Therefore, an analytical solution to find the optimal RF duration to minimize TE is not feasible. We propose the use of iterative optimization to determine τRF that optimizes a desired timing parameter of a sequence building block.

Gradient Usage Optimization

The rotation matrix given above in equations 1 and 2 is fixed for a given slice orientation. It is desired to determine the maximum limit $G_{max}$ for the phase encoding, the read and the slice gradients to make sure that the physical gradient limits are not exceeded for the specific slice orientation.

Worst case $G_x$ for a given orientation is when $$|G_P|=|G_R|=|G_s|=G_{max}$$

AND signs of $G_P$, $G_R$ and $G_S$ are such that values in the sum $G_x=R_{11}G_P+R_{12}G_R+R_{13}G_S$ add up.
Thus, worst-case $G_x=(|R_{i1}|+|R_{i2}|+|R_{i3}|)G_{Max}$
Similar expressions exist for the other axes.
Thus, maximum gradient along any physical axis for this $$\max_{i\in\{1,2,3\}}(|R_{i1}|+|R_{i2}|+|R_{i3}|)G_{Max}$$

Figure 2:
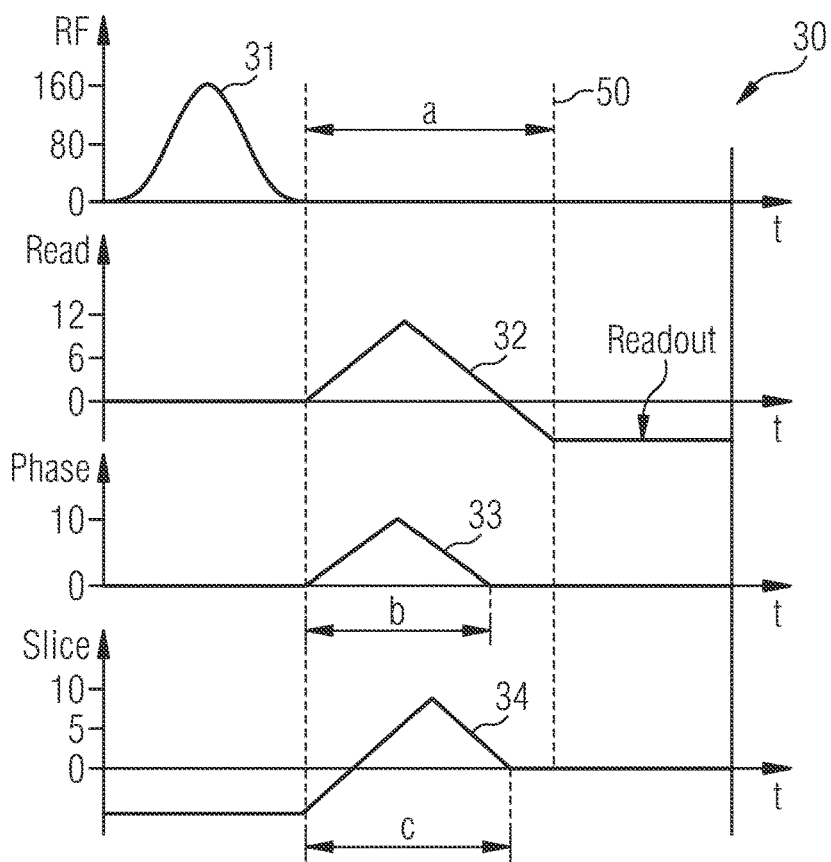
FIG. 2 shows a schematic view of an MR imaging sequence before optimization.

Just picking the physical axis with the worst "worst case"
Thus, one can choose $$G_{Max} \leq G_{AbsMax}\Big/\max_{i\in\{1,2,3\}}(|R_{i1}|+|R_{i2}|+|R_{i3}|),$$

which is always $\geq G_{AbsMax}/\sqrt{3}$
Similar expressions exist for the slew rate.
Thus, by considering a specific rotation matrix, one can design logical gradients with higher slew rates and amplitudes, compared with the naïve approach described in the previous section In the following the algorithm to minimize the duration of a sequence building block is discussed in more detail. FIG. 2 shows a schematic view of an MR imaging sequence 30 which comprises at least one sequence block 50. In the embodiment shown only a single sequence block 50 is shown. However it should be understood that the imaging sequence 30 can comprise a plurality of different sequence blocks. The duration of this sequence block 50 and the gradient switching is now minimized as will be discussed below in further detail. The sequence block 50 comprises overlapping gradients 32, 33 and 34. The read-out gradient 32 is the longest gradient and has a duration of a wherein the duration of the phase encoding gradient 33 is b and the duration of the slice encoding gradient is c.

An iterative approach will be used to minimize the duration of the sequence building block 50. The axis specific logical gradient limits and gradients are used to better utilize the available physical gradients. Also instead of determining the logical gradient limits applicable to the entire imaging sequence, these limits will be determined for each of the blocks 50 of the sequence to optimize the performance on a block by block basis.

First, a short overview is given, then the method is discussed in detail. The method results in scaling factors for the read, the phase and the slice encoding, namely Scalingfactor$_{read}$, Scalingfactor$_{phase}$, and Scalingfactor$_{slice}$. The maximum allowed gradient amplitude and slew rate for the logical axis are determined by scaling the physical gradient specifications by the respective scaling factors. The aim of the algorithm is to determine these scaling factors to ensure that first of all the system specifications along the physical axes are not violated, and secondly the logical gradients within the block cannot be stretched further without increasing the duration of the block, when prepared with minimum possible duration according to the allocated amplitude and slew rate. This ensures that none of the logical axis is allocated the maximum amplitude and slew rate greater than needed. The method can determine the optimal scaling factors for a given slice geometry. Alternatively, it can determine these factors for a worst-case scenario in case the calculation of the sequence block is required without a prior knowledge of the slice orientation.

As a first example the scenario might be considered in which for a given sequence block only the phase and the slice gradients might be needed with equal amplitudes.

As an example, consider the following scenario:
Supposed for a given sequence segment (or block), one only needs to run phase and slice gradients with equal amplitudes. The approach given above suggests a maximum logical gradient amplitude limit $$G_{AbsMax}\Big/\max_{i\in\{1,2,3\}}(|R_{i1}|+|R_{i2}|+|R_{i3}|).$$

However, since read gradient is not needed in this segment anyway, the maximum limit of $$G_{AbsMax}\Big/\max_{i\in\{1,2,3\}}(|R_{i1}|+|R_{i3}|)$$

can be chosen along phase and slice, and 0 along read.
Thus, by considering logical axis specific requirements, we can increase the logical gradient amplitude or slew rate that we can use along the more demanding axes, resulting in reduced duration of the sequence segment.

The next example is more concrete and describes one of the methods in the disclosure more precisely.

Here are the outcomes that are considered as needed:
Read, slice and phase specific gradient limits, so that each axis can get "just the right" amount of amplitude and slew rate
Read specific limit=ScalingFactor$_{Read}$ times (physical limit) which is just a definition
Similar expression are determined for phase and slice
Consider the sequence block 50 within dotted lines of FIG. 2.
These waveforms are initially obtained by utilizing identical amplitude and slew rate limits along all axes, with maximum amplitude $$G_{AbsMax}\Big/\max_{i\in\{1,2,3\}}(|R_{i1}|+|R_{i2}|+|R_{i3}|)$$

and slew rate $$SR_{AbsMax}\Big/\max_{i\in\{1,2,3\}}(|R_{i1}|+|R_{i2}|+|R_{i3}|).$$

The waveforms between dotted lines can be stretched to fill the entire space between dotted lines without affecting image quality. Thus, phase and slice need less amplitude and slew rate compared with read, as shown by gradients 42 and 43 in FIG. 3.

The maximum gradient limit for read is defined as follows=(maximum physical limit) times ScalingFactor$_{Read}$. Similar expressions are determined for phase and slice. These factors are unknown for now.

Then ScalingFactor$_{Phase}=\alpha$ ScalingFactor$_{Read}$, where $\alpha<1$ (i.e. reduced requirement along phase). $\alpha$ is unknown for now and is a scaling parameter.

Similarly ScalingFactor$_{Slice}=\beta$ ScalingFactor$_{Read}$, where $\beta<1$ (i.e. reduced requirement along slice). $\beta$ is unknown for now and is a scaling parameter.

Furthermore a stretch ratio is defined which is the ratio by which a waveform along an axis can be stretched without affecting total time of the block.

Read can not be stretched without changing timing- →StretchRatioRead=1.

stretch phase→StretchRatioPhase=a/b stretch Slice→StretchRatioSlice=a/c $\alpha$ can be approximated as StretchRatioRead/StretchRatioPhase=b/a. The more the phase gradient can be stretched compared with read (when prepared with same initial limits), the less the requirement along phase is. Similarly, $\beta$ is approximately c/a Now given estimated relative requirements along PRS, it is appropriate to allocate the following gradient amplitude limits along read, phase and slice:

Read limit=ScalingFactor$_{Read}$*$G_{AbsMmax}$

Phase limit=αScalingFactor$_{Read}$*$G_{AbsMax}$

Slice limit=βScalingFactor$_{Read}$*$G_{AbsMax}$

Figure 3:
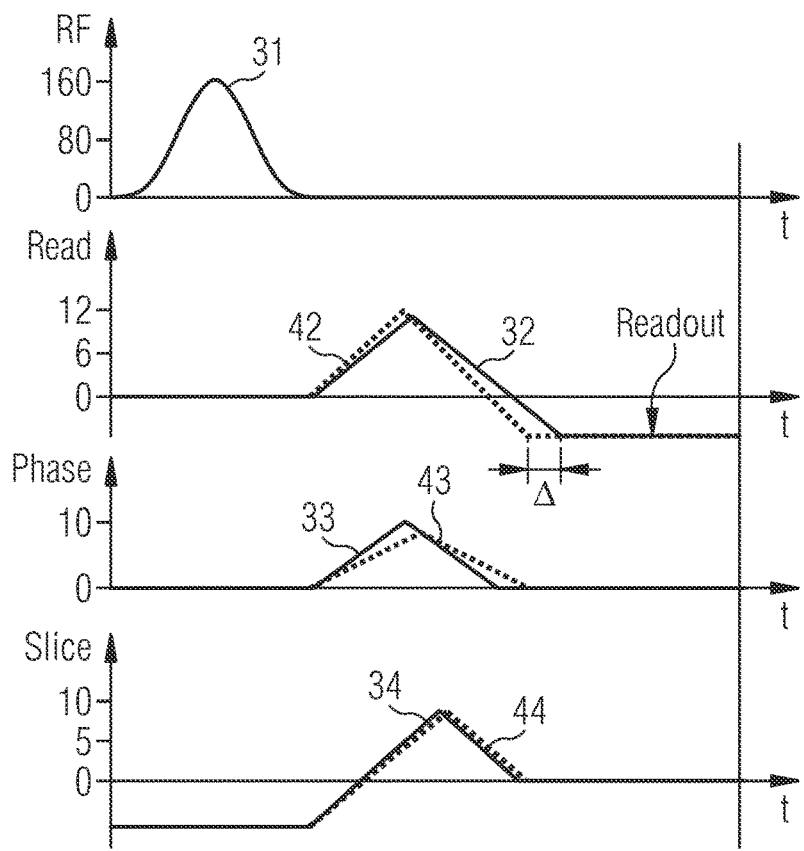
FIG. 3 shows a schematic view of the MR imaging sequence of FIG. 2 after a first optimization step.

The stretching is shown in FIG. 3. After stretching the phase to from 33 to 43 and the slice from 34 to 44 it is possible to shorten the Read gradient from 32 to 42 as shown by the dotted lines.

Given these three limits, the worst-case gradient along x, y, z axis would be:

$$G_{MaxAbs} ScalingFactor_{Read} \max_i(\alpha|R_{i1}| + |R_{i2}| + \beta|R_{i3}|),$$

When the rotation matrix is unknown, it can be shown that the worst case gradient amplitude is $G_{MaxAbs}$ScalingFactor$_{Read}\sqrt{1+\alpha^2+\beta^2}$ Thus, ScalingFactor$_{Read}$ should be chosen as $$1 \Big/ \max_i(\alpha|R_{i1}| + |R_{i2}| + \beta|R_{i3}|)$$

to stay within gradient limits.

When the rotation matrix is unknown, it can be shown that the worst case ScalingFactor$_{Read}=1/\sqrt{1+\alpha^2+\beta^2}$ Then the sequence block can then be prepared again, after limiting P, R, and S gradients using limits discussed above.

If $\alpha$ and $\beta$ were determined accurately, all three gradient lobes will perfectly fill the available space between dotted lines. Otherwise, $\alpha$ and $\beta$ can be updated according to how much it is possible to stretch each of the waveforms, and the method can be repeated until convergence.

To sum up:
Rationale: Determine $\alpha$ and $\beta$ and ScalingFactor$_{Read}$ such that
the gradients, when prepared with logical axis specific amplitude and slew rate limits of $$\begin{bmatrix}\alpha\\1\\\beta\end{bmatrix} ScalingFactor_{Read} G_{AbsMax}$$

and $$\begin{bmatrix}\alpha\\1\\\beta\end{bmatrix} ScalingFactor_{Read} SR_{AbsMax}$$

cannot be stretched further (e.g. each axis gets just right amount of specs)

Physical gradient limits are not exceeded.

Figure 4:
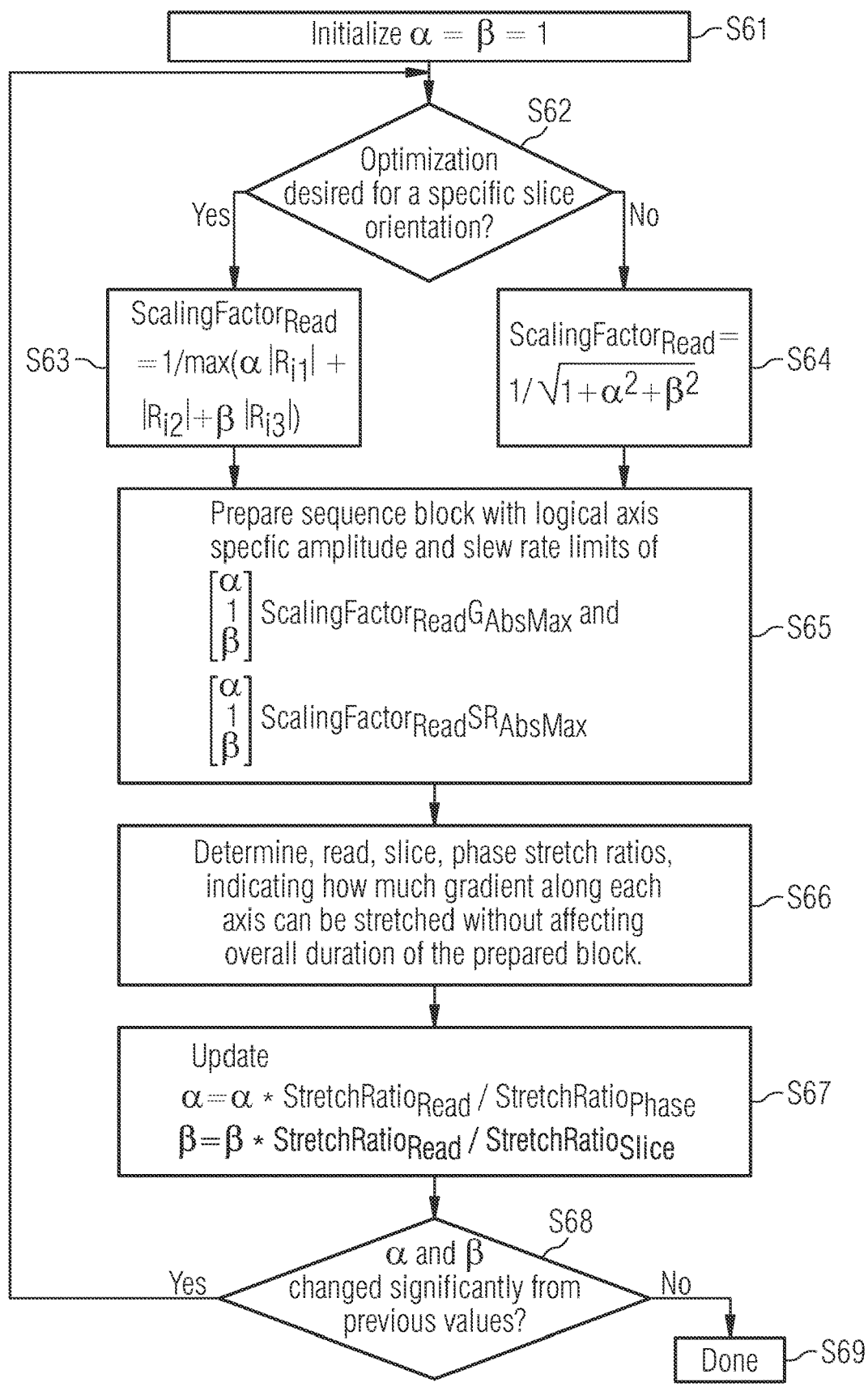
FIG. 4 shows a flowchart of an iterative method used to optimize the MR imaging sequence, here especially the gradient switching.

FIG. 4 summarizes the iterative process. In step S 61 $\alpha$ and $\mu$ are initialized, here to 1. In step S 62 it is asked whether optimization of the gradient switching should be carried out for a specific slice orientation. If this is the case the scaling factor is determined in step S 63 as shown and if the optimization is not done for a specific slice orientation the scaling factor is determined as shown in step S 64 and as discussed above. In the next step S 65 the sequence block is prepared with the logical axis gradients in dependence on the scaling factors, the absolute limits on the physical gradients, and the slew rate. This can be an imaging sequence as shown in FIG. 2. In step S 66 it is determined how the different gradient switchings can be stretched, meaning that it is determined how much the gradient can be stretched along each axis without affecting the overall duration of the prepared imaging block 50. Applied to the example shown in FIG. 2 gradient 33 can be stretched by the ratio a/b and gradient 34 can be stretched by the ratio a/c. After the stretching the scaling parameters $\alpha$ and $\beta$ are updated as shown and in step S 68 it is asked whether the scaling parameters changed significantly from the previous values. This can be used as a stop parameter to determine how much iterations are carried out. By way of example, if the change is smaller than a predefined threshold, the method may be reiterated with step S 62 and if not, the iterative method is finished in step S 69.

FIG. 5 summarizes some of the steps which can be carried out by the MR imaging system 10, by way of example by processing unit 27 of FIG. 1. In step S 71 the grading requirements are determined for the logical gradients which are switched along the logical gradient axes. In step S 72, based on the determined gradient requirements a reference gradient is determined among the logical gradients having the longest minimum duration relative to the remaining logical gradients. Applied to the example shown in FIG. 2, the reference gradient is gradient 32 switched along the read direction as it has the highest amplitude and the highest overall gradient moment when the absolute value is considered. In step S 73 the scaling factors are determined for each of the logical gradients. In step S 74 the stretch ratios are determined including the stretch parameters $\alpha$ and $\beta$. In step S 75 the scaling factors for the logical gradients are updated taking into account the stretch ratios and in step S 76 the optimized drain amplitudes are determined as discussed in further detail above.

In addition to the gradient switching optimization, the RF optimization can be carried out. Here a timing parameter such as an eco time TE or a total duration, the repetition time TR may be optimized for a spatially selective RF pulse. The optimization uses a minimum and a maximum allowed value of the RF duration ($\tau_{min}$, $\tau_{max}$) which are determined taking into account system requirements such as the maximum possible amplitude of the RF pulse. Furthermore, safety constraints may be considered, such as the specific absorption rate, SAR. Then, based on the determined minimum and maximum allowed values of the RF duration, ($\tau_{min}$, $\tau_{max}$), an iterative search is carried out to determine an optimized RF duration which results in an optimal and minimum timing of the imaging sequence.

This is shown in further detail in FIG. 6. First of all the minimum and the maximum duration $\tau_{min}$, $\tau_{max}$) of the RF pulse is determined. The search space is then defined by this minimum and maximum duration.

$$\tau_{min} \leq \tau_{RF} \leq \tau_{max} \quad (7)$$

The iterative search is started with the minimum and the maximum value and for these values the corresponding duration of the sequence block is determined using the values of the RF pulses and the other values known for the gradient switching etc. In step S 82 further different RF durations are determined at which the objective function such as the duration of the sequence block is evaluated during optimization. Here a golden ratio is used to search the space between the minimum and maximum values as given by equation 8.

$$\phi = \frac{1+\sqrt{5}}{2} \quad (8)$$

In step S 83 it is then asked whether the minimum value for the first search space between $\tau_1$ and $\tau_2$ is smaller than the minimum value of the second search space between $\tau_3$ and $\tau_4$. The minimum is then determined S84. The minimum value is then set as the optimized duration in steps 85 and 86. The search space is then reduced in step S 87 and new values are determined for $\tau_2$ and the corresponding duration of the sequence block in step S 88. The same is done in step S 89 to S 93 for the other search space in case this search space contains the minimum value. In step S 94 it is then asked whether new maximum and minimum values are lower than a threshold. If this is not the case, the method is repeated with step 83 and the following, and if not the method ends in step S 95. The optimized duration $\tau_{opt}$ is the RF duration which corresponds to the minimum sequence block duration.

The method shown uses the golden ratio search algorithm with sequence block duration as objective function. Other iterative optimization methods might be used or other stopping criteria in step S 90 such as the maximum number of iterations.

From the above said some general conclusions can be drawn.

As far as the scaling factors are concerned, the scaling factors of the remaining logical gradient can be correlated to the scaling factor of the reference gradient using the scaling parameters $\alpha$ and $\beta$. These scaling parameters are then smaller than 1 as mentioned above.

Each of the scaling parameters may be approximated based on the stretch ratios of the corresponding logical gradient to the reference gradient. Applied to the example given in FIG. 2 this means that $\alpha$ can be approximated by b/a and $\beta$ can be approximated by c/a.

As discussed in connection with FIG. 4, the method can be carried out iteratively with an iterative determination of the reference gradient, the scaling factors and the stretch ratios, wherein updated scaling factors are determined until a stop condition is reached. The stop condition can depend on the fact how much the scaling factors changed from one iteration to the next iteration.

The stretch ratio for each of the remaining logical gradients can correspond to a ratio of the longest minimum duration relative to a duration of the logical gradient along the corresponding remaining logical axes.

Preferably, the iteration is carried out for sequence blocks in which at least two out of the three logical gradients are switched.

The gradient requirements for each of the logical gradients may be determined based on an absolute value of gradient moment applied the corresponding logical gradient direction. In the example shown in FIG. 2 the gradient moment, which corresponds to the absolute value of the integral below the gradient switching is the highest in the read direction.

The stretch ratios are determined such that a gradient moment remains constant when a switching period is increased and the gradient amplitude is decreased.

The optimized amplitudes of the logical gradients can be determined based on the updated scaling factors and the maximum physical gradient limits along the physical axes.

Furthermore, the determination of the scaling factor may depend on the fact whether the method is carried out for a defined slice orientation or for an unknown slice orientation as mentioned above in FIG. 4 in steps S 63 or S 64.

Furthermore, it is possible to optimize the RF duration as discussed above where an iterative optimization procedure was used.

The optimization can comprise the determination of a minimum and a maximum allowed value of the RF duration taking into account RF constraints of the MR imaging system. Furthermore safety constraints such as SAR limits can be considered for determining the optimized RF duration.

The above discussed gradient optimization approach is applicable to situations where the plurality of the logical gradients is switched within a sequence block to be optimized as was shown in FIG. 2.

Furthermore, the proposed gradient usage optimization approach is applicable in situations where the slice orientation is not known at the beginning. The RF duration based optimization approach helps leverage a typically fixed sequence parameter such as the RF duration to further optimize the sequence.

The proposed gradient optimization uses the duration requirements along the logical axes to determine degraded load along the logical axes. For a given $\alpha$ and a given $\beta$, the gradient scaling factors are determined based on different logical directions.

The proposed methods can play an important role in enabling a wider adaptation of systems with a reduced gradient performance. MR systems with a reduced gradient performance can benefit from the optimized usage of the gradient system and the method will help to achieve shorter repetition times TR and echo times TE. The low field systems with especially benefit from the RF duration based optimization as the RF duration can be manipulated more freely at lower fields due to the reduced specific absorption rate, SAR. The pulse sequences for the real time therapy will benefit from the increased frame rates and reduced artifacts due to the reduced repetition echo time achieved with the method discussed above.

The invention claimed is:

1. A method for optimizing an MR imaging sequence which comprises a plurality of sequence blocks, the method comprising for at least one of the sequence blocks:
   determining gradient requirements of logical gradients switched along logical gradient axes including a read, slice and phase axes in the MR imaging sequence, determining, based on the determined gradient requirements, a reference gradient among the logical gradients having a longest minimum duration relative to remaining logical gradients within the sequence block during which the reference gradient is switched on, determining a scaling factor for each of the logical gradients, each scaling factor indicating a relationship between the maximum gradient amplitude along the logical gradient axis and a maximum physical gradient limit along a physical axis, determining a stretch ratio for each of the remaining logical gradients indicating how a gradient switching period of the remaining logical gradients is increased within a limit of the longest minimum duration while a corresponding amplitude of the remaining logical gradients is reduced, updating the scaling factors for the logical gradient factors taking into account the determined stretch ratios, determining optimized amplitudes for the logical gradients based on the updated scaling factors.

2. The method according to claim 1, wherein the scaling factors of the remaining logical gradients are correlated to the scaling factor of the reference gradient using scaling parameters ($\alpha$, $\beta$), wherein the scaling parameters ($\alpha$, $\beta$) are smaller than 1.

3. The method according to claim 2, wherein each of the scaling parameters is approximated based on the stretch ratio of the corresponding logical gradient to the reference gradient.

4. The method according to claim 1, wherein the method is carried out iteratively with iterative determination of the reference gradient, scaling factors and stretch ratios and updated scaling factors until a stop condition is reached.

5. The method according to claim 4, wherein the stop condition depends the fact how much the scaling factors change from one iteration to the next iteration.

6. The method according to claim 1, wherein the scaling factors are approximated using the stretch ratios.

7. The method according to claim 1, wherein the stretch ratio for each of the remaining logical axis corresponds to a ratio of the longest minimum duration relative to a duration of the logical gradient along the corresponding remaining logical axis.

8. The method according to claim 1, wherein the method is carried out for the sequence blocks in which at least 2 from the 3 logical gradients are switched.

9. The method according to claim 1, wherein the gradient requirements for each of the logical gradients are determined based on an absolute value of a gradient moment applied in the corresponding logical gradient axis.

10. The method according to claim 1, wherein the stretch ratios are determined such that a gradient moment remains constant when a switching period is increased and a gradient amplitude is decreased.

11. The method according to claim 1, wherein the optimized amplitudes of the logical gradients are determined based on the updated scaling factors and the maximum physical gradient limits along the physical axes.

12. The method according to claim 1, wherein determination of the scaling factor depends on the fact whether the method is carried out for a defined slice orientation of a imaging slice where MR imaging sequence should be applied.

13. The method according to claim 1, further optimizing an RF duration of at least one RF pulse applied in the MR imaging sequence based on an iterative optimization procedure.

14. The method according to claim 13, wherein optimizing comprises determining a minimum and maximum allowed values of the RF duration taking into account RF constraints of an MR imaging system implementing the MR imaging sequence.

15. An MR imaging system comprising a processor coupled to a memory and configured to:

determine gradient requirements of logical gradients switched along logical gradient axes including a read, slice and phase axes in the MR imaging sequence, determine, based on the determined gradient requirements, a reference gradient among the logical gradients having a longest minimum duration relative to remaining logical gradients within the sequence block during which the reference gradient is switched on, determine a scaling factor for each of the logical gradients, each scaling factor indicating a relationship between the maximum gradient amplitude along the logical gradient axis and a maximum physical gradient limit along a physical axis, determine a stretch ratio for each of the remaining logical gradients indicating how a gradient switching period of the remaining logical gradients is increased within a limit of the longest minimum duration while a corresponding amplitude of the remaining logical gradients is reduced, update the scaling factors for the logical gradient factors taking into account the determined stretch ratios, determine optimized amplitudes for the logical gradients based on the updated scaling factors.

16. The MR imaging system according to claim 15, further being configured to correlate the scaling factors of the remaining logical gradients to the scaling factor of the reference gradient using scaling parameters ($\alpha$, $\beta$), wherein the scaling parameters ($\alpha$, $\beta$) are smaller than 1.

17. The MR imaging system according to claim 16, further being configured to approximate each of the scaling parameters based on the stretch ratio of the corresponding logical gradient and the stretch ratio of the reference gradient.

18. The MR imaging system according to claim 15, further being configured to carry out the optimization iteratively with iterative determination of the reference gradient, scaling factors and stretch ratios and updated scaling factors until a stop condition is reached.

19. The MR imaging system according to claim 18, wherein the stop condition depends the fact how much the scaling factors change from one iteration to the next iteration.

20. The MR imaging system according to claim 15, further being configured to determine the gradient requirements for each of the logical gradients based on an absolute value of a gradient moment applied in the corresponding logical gradient axis.

21. The MR imaging system according to claim 15, further being configured to determine the stretch ratios such that a gradient moment remains constant when a switching period is increased and a gradient amplitude is decreased.

22. The MR imaging system according to claim 15, further being configured to determine the optimized amplitudes of the logical gradients based on the updated scaling factors and the maximum physical gradient limits along the physical axes.

23. A non-transitory computer-readable media storing computer instructions that, when executed by one or more processors, cause the one or more processors to perform the steps of:

determining gradient requirements of logical gradients switched along logical gradient axes including a read, slice and phase axes in the MR imaging sequence, determining, based on the determined gradient requirements, a reference gradient among the logical gradients having a longest minimum duration relative to remaining logical gradients within the sequence block during which the reference gradient is switched on, determining a scaling factor for each of the logical gradients, each scaling factor indicating a relationship between the maximum gradient amplitude along the logical gradient axis and a maximum physical gradient limit along a physical axis, determining a stretch ratio for each of the remaining logical gradients indicating how a gradient switching period of the remaining logical gradients is increased within a limit of the longest minimum duration while a corresponding amplitude of the remaining logical gradients is reduced, updating the scaling factors for the logical gradient factors taking into account the determined stretch ratios, determining optimized amplitudes for the logical gradients based on the updated scaling factors.

\* \* \* \* \*